(12) United States Patent
Uang et al.

(10) Patent No.: US 6,989,325 B2
(45) Date of Patent: Jan. 24, 2006

(54) SELF-ASSEMBLED NANOMETER CONDUCTIVE BUMPS AND METHOD FOR FABRICATING

(75) Inventors: Ruoh-Huey Uang, Hsin-Dian (TW); Yu-Hua Chen, Nantou (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/653,860

(22) Filed: Sep. 3, 2003

(65) Prior Publication Data

US 2005/0048697 A1    Mar. 3, 2005

(51) Int. Cl.
    *H01L 21/44*    (2006.01)
(52) U.S. Cl. ...................................... 438/613
(58) Field of Classification Search ............ 438/99, 438/800, 613; 257/780
    See application file for complete search history.

(56) References Cited

U.S. PATENT DOCUMENTS

| 6,515,339 B2* | 2/2003 | Shin et al. .................. 257/368 |
| 6,517,995 B1* | 2/2003 | Jacobson et al. ........... 430/320 |
| 6,737,939 B2* | 5/2004 | Hoppe et al. ............... 333/186 |
| 6,741,019 B1* | 5/2004 | Filas et al. .................. 313/355 |
| 2001/0031900 A1* | 10/2001 | Margrave et al. .......... 570/126 |
| 2004/0075464 A1* | 4/2004 | Samuelson et al. ........... 326/37 |

* cited by examiner

*Primary Examiner*—Matthew Smith
*Assistant Examiner*—Lex H. Malsawma
(74) *Attorney, Agent, or Firm*—Akin Gump Strauss Hauer & Feld, LLP

(57) ABSTRACT

A self-assembled nanometer conductive bump and a method for fabricating the bump. In the method, a multiplicity of carbon nanotubes that are coated at two ends with chemically functional groups is first provided. A substrate that is equipped with at least one bond pad on a surface is then positioned juxtaposed to the carbon nanotubes for forming a bond between the carbon nanotubes and the metal pads facilitated by a chemical affinity existed between the functional groups and the metal pad.

6 Claims, 2 Drawing Sheets

SELF-ASSEMBLED NANOMETER CONDUCTIVE BUMPS AND METHOD FOR FABRICATING

FIELD OF THE INVENTION

The present invention generally relates to nanometer conductive bumps and a method for fabricating the bumps. More particularly, the present invention is related to nanometer conductive bumps formed by carbon nanotubes and a method for fabricating the bumps.

BACKGROUND OF THE INVENTION

In the development of modern semiconductor devices, the requirements for ever increasing device density and ever decreasing device dimensions are frequently encountered. As a result, requirements for the packaging and interconnection of devices become more stringent. The technology of flip-chip bonding or flip-chip direct chip attachment (DCA) have been developed to satisfy such stringent requirements in semiconductor packaging.

In the technology of flip-chip bonding, a multiplicity of bumps is normally formed on the active surface of a wafer. The multiplicity of bumps is formed on top of a multiplicity of input/output bond pads in order to provide the function for electrical input and electrical output. Conventionally, the multiplicity of bumps is formed by a solder material such as lead-tin solder. The flip-chip bumping technology has been broadly used to replace the out-dated lead-frame technology for connecting a semiconductor device to a printed circuit board. The flip-chip technology provides the benefit of reducing the signal transmission distance between a semiconductor device and a circuit board and therefore, is especially suitable for packaging high speed semiconductor elements.

In the conventional flip-chip technology, the bumps are formed in the shape of a ball due to the surface tension of the solder material. As a result, a minimal distance between the input/output pads on the wafer must be maintained in order to avoid any possible occurrence of electrical short in-between neighboring bumps due to physical contact. For instance, when a conventional wire bonding technique is used for interconnecting a semiconductor device to a circuit board, the minimal distance between the input/output pads is about 75–100 microns. However, when the flip-chip technology is used for interconnecting a semiconductor device to a circuit board, the minimal distance between the input/output pads is increased to at least 150 microns in order to ensure the reliability of the device.

With the recent advancement in semiconductor technology, semiconductor wafers have been developed to produce chips having multiple functions. The very nature of the multiple-functioned chips require a larger number of input/output pads on the wafer surface. Since the total area of the wafer is limited (or fixed), the increasing number of input/output pads necessarily requires a smaller distance between the pads to be maintained in order to accommodate the larger number of pads. When the flip-chip technology is utilized in providing the interconnection, and while the distance between neighboring input/output pads must be reduced, a logical solution is to carefully select the bump material in order to either make smaller bumps or to reduce the bump-to-bump distance.

Carbon nanotubes have been used recently for providing electrical connections between semiconductor devices and a substrate board based on its inherent properties as both a semi-conducting body and an electrical conducting body. In order to utilize carbon nanotubes for electrical interconnection in flip-chip bonding, the carbon nanotubes are normally formed by a chemical vapor deposition technique conducted in a suitable electrical field. The electrical field induces a growth of the carbon nanotubes from an input/output pad either horizontally or vertically. However, the lowest possible operating temperature for the chemical vapor deposition process is about 700° C., which may damage the devices formed on the wafer. The conventional CVD method for forming carbon nanotubes is therefore not suitable for forming conductive bumps on wafers. Other reaction methods utilizing a direct interaction between metal-carbide which also requires high temperature and is similarly undesirable. Still other reaction methods utilizing arc discharge or laser ablation on graphite obtaining free-standing carbon nanotubes that need a high temperature metal-carbide reaction to fix the carbon nanotubes on metal I/O pad.

It is therefore an object of the present invention to provide nanometer conductive bumps that do not have the drawbacks or shortcomings of conventional conductive bumps.

It is another object of the present invention to provide nanometer conductive bumps for use in a flip-chip bonding technology.

It is a further object of the present invention to provide nanometer conductive bumps that are formed by carbon nanotubes.

It is another further object of the present invention to provide self-assembled nanometer conductive bumps that can be formed by a self-assembly method.

It is still another object of the present invention to provide a method for fabricating self-assembled nanometer conductive bumps with carbon nanotubes.

It is yet another object of the present invention to provide a method for fabricating self-assembled nanometer conductive bumps by first coating carbon nanotubes with chemical functional groups.

SUMMARY OF THE INVENTION

In accordance with the present invention, self-assembled nanometer conductive bumps and a method for fabricating the bumps are disclosed.

In a preferred embodiment, a self-assembled method for fabricating nanometer conductive bumps can be carried out by the operating steps of providing a multiplicity of carbon nanotubes, each of the multiplicity of carbon nanotubes has two free ends; attaching to each of the two free ends of the multiplicity of carbon nanotubes a plurality of functional groups; providing a substrate that is equipped with at least one metal pad on a surface of the substrate; and attaching a free end of each of the multiplicity of carbon nanotubes to the at least one metal pad by chemical affinity existed between the plurality of functional groups on the end of the carbon nanotube and the metal pad.

The self-assembly method for fabricating nanometer conductive pumps may further include the step of attaching the multiplicity of carbon nanotubes vertically to the metal pad by van der Waal force existed between the multiplicity of carbon nanotubes. The method may further include the step of providing the functional groups by selecting from the group consisting of thiol groups, amide groups, imine groups and isocyanide groups. The method may further include the step of fabricating the metal pad from a metal selected from the group consisting of gold, silver, copper, platinum and palladium.

The present invention is further directed to a self-assembly method for fabricating nanometer conductive bumps which can be carried out by the operating steps of providing a multiplicity of carbon nanotubes, each of the multiplicity of carbon nanotubes has two free ends; attaching to the two free ends of the multiplicity of carbon nanotubes a plurality of functional groups; providing a template having at least one metal pad on a surface; attaching the multiplicity of carbon nanotubes to the at least one metal pad by an attraction force existed between the plurality of functional groups on the free end of the carbon nanotubes and the metal pad; attaching a multiplicity of nanometer-scaled metal balls to the other free ends of the multiplicity of carbon nanotubes forming a nanometer scaled metal layer; providing a substrate having at least a bond pad on a surface; attaching the nanometer-scaled metal layer on the multiplicity of carbon nanotubes to the bond pad on the substrate; and removing the template.

The self-assembly method for fabricating nanometer conductive bumps may further include the step of selecting the functional groups from a group consisting of thiol groups, amide groups, imine groups and isocyanide groups. The method may further include the step of fabricating the nanometer-scaled metal layer from a metal selected from the group consisting of gold, silver, copper, platinum and palladium. The method may further include the step of removing the template by a wet etch method. The method may further include the step of forming the nanometer-scaled metal layer with a metal that provides wetting characteristics during the attachment process between the nanometer-scaled metal layer and the bond pad on the substrate, or the step of attaching the nanometer-scaled metal layer to the bond pad on the substrate by a solder layer.

The present invention is still further directed to a nanometer conductive bump structure which includes a substrate that has a top surface; a bottom nanometer-scaled metal layer situated on the top surface of the substrate; a multiplicity of carbon nanotubes attached to the bottom nanometer-scaled metal layer at one end projecting vertically away from the bottom nanometer-scaled metal layer; and a top nanometer-scaled metal layer attached to and in electrical communication with the free ends of the multiplicity of carbon nanotubes.

The nanometer conductive bump structure may further include chemically active functional groups in-between the multiplicity of carbon nanotubes and the top and bottom nanometer-scaled metal layers. The chemically active functional group may be selected from the group consisting of thiol groups, amide groups, imine groups and isocyanide groups. The nanometer-scaled metal layer may be formed by a metal selected from the group consisting of gold, silver, copper, platinum and palladium. The multiplicity of carbon nanotubes has a length between about 1 $\mu$m and about 2 $\mu$m. The substrate may be a silicon substrate.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a self-assembly method for fabricating nanometer conductive bumps and the carbon nanotube conductive bumps fabricated. The carbon nanotube conductive bumps can be used to provide electrical connection between a semiconductor device and a substrate. The carbon nanotubes are self-assembled onto metal pads situated on a substrate by first attaching chemically functional groups to the ends of the carbon nanotubes.

To achieve the present invention, the two ends of the carbon nanotubes are attached chemically functional groups and then, due to a chemical affinity existed between the functional groups and the metal pad, bond the carbon nanotubes to the metal pads. The term "self-assemble" is thus used to describe the fact that the carbon nanotubes are able to assemble themselves onto the metal pad by the strong chemical affinity existed between the chemically functional groups and the metal pad. To facilitate the present invention novel method, different types of chemically functional groups can be matched with different types of metal used in the metal pads such that there is a strong bonding force existed between the metal pad and the carbon nanotubes. The bonding may further be improved, if desired, by adding a layer of solder in-between the carbon nanotubes and the metal pad to improve its bond strength and the reliability of the conductive bump formed with the carbon nanotubes.

In the present invention process, after one end of the carbon nanotubes is first bonded to a metal pad by the self-assembly method, the other end of the carbon nanotubes coated with the chemically functional groups is then covered with a multiplicity of nanometer-scaled metal spheres. The nanometer-scaled metal spheres are then formed into a nanometer-scaled metal layer for acting as a wetting layer during a soldering process for connecting the nanometer-scaled metal layer to the bond pads on the substrate. In the final step of the process, the substrate is removed by a wet etch process to produce the present invention nanometer conductive bumps.

Figure 1:
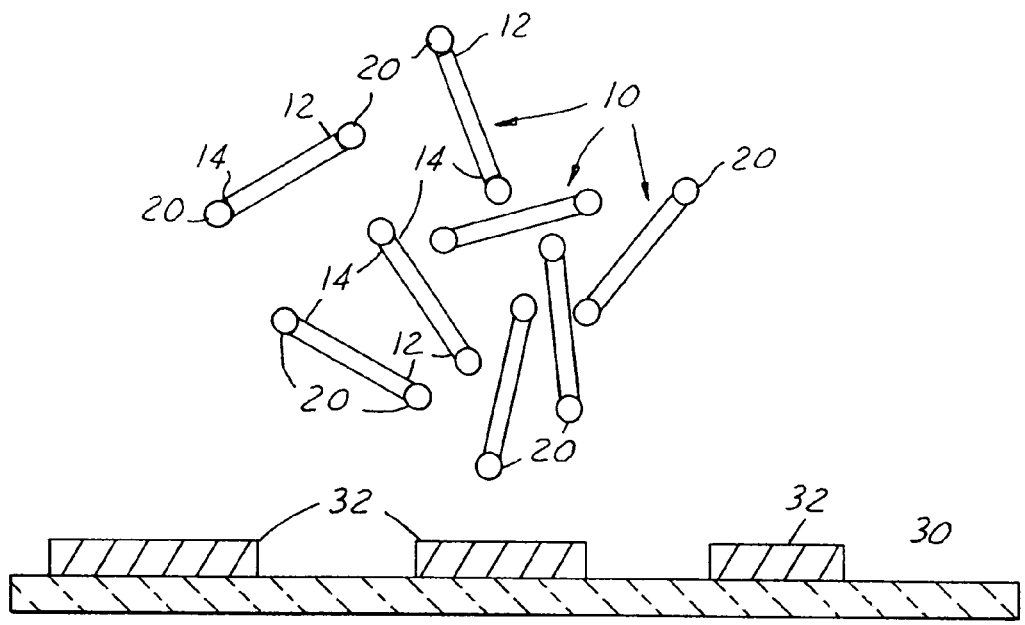
FIG. 1 is an illustration of a multiplicity of carbon nanotubes having functional groups attached to their ends and positioned relative to a substrate equipped with metal pads on top.

Referring initially to FIG. 1, wherein carbon nanotubes 10 having two ends 12, 14 coated with chemically functional groups are shown in an enlarged, cross-sectional view. The chemically functional groups 20 coated may be advantageously selected from the group consisting of thiol groups, amide groups, imine groups and isocyanide groups. When the thiol groups are utilized for coating the free ends 12,14 of the carbon nanotubes 10, the two free ends 12,14 are attached with sulfur atoms. Similarly, when the chemically functional groups utilized are the amide groups, the two free ends 12,14 of the carbon nanotubes 10 are provided with nitrogen atoms. Similarly, when the chemically functional groups added are isocyanide groups, the two free ends 12,14 of the carbon nanotubes 10 are provided with carbon atoms.

As shown in FIG. 1, the carbon nanotubes 10 are positioned relative to a substrate 30 that has a plurality of metal bond pads 32 formed on top.

Figure 2:
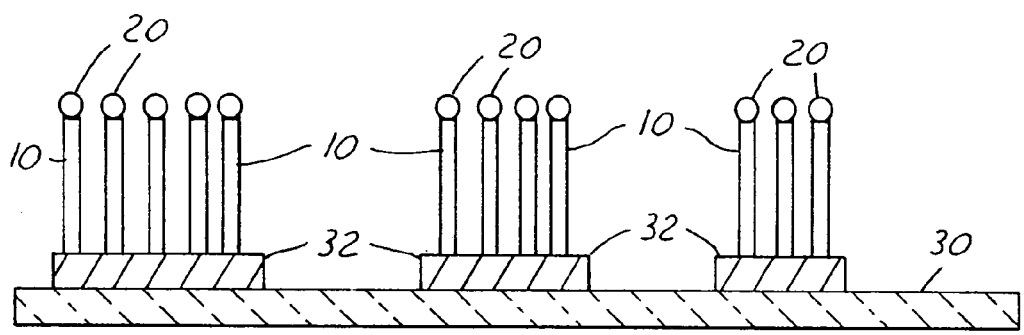
FIG. 2 is an enlarged, cross-sectional view of the present invention carbon nanotubes self-assembled onto the metal pads on the substrate.

Referring now to FIG. 2, wherein the carbon nanotubes 10 are bonded to the metal bond pads 32 by a strong chemical affinity existed between the functional groups 20 and the metal pad 32, i.e. the carbon nanotubes 10 are bonded to the metal pads 32 by a self-assembly method. For instance, it has been found that sulfur atoms are strongly attracted to gold or silver atoms, while nitrogen atoms are strongly attracted to either copper atoms or platinum. Similarly, carbon atoms in the isocyanide group are strongly attracted to platinum atoms. The present invention provides the added benefit that different types of chemically functional groups can be used to coat the ends of the carbon nanotubes in order for forming a strong bond with different metal pads. It is thus possible to match specific functional groups to a specific metal material.

The present invention novel self-assembly method for fabricating nanometer conductive bumps is shown in detail in FIGS. 3A–3D in a process flow diagram. In this example of the preferred embodiment, thiol groups are utilized as the chemically functional groups for coating the ends 12, 14 of the carbon nanotubes 10 such that sulfur atoms are attached to the ends as a result. A strong bonding force between the sulfur atoms and the gold atoms on the metal pad 32 leads to a formation of the carbon nanotube bumps. The present invention novel method further utilizes van der Waal forces existed in-between the carbon nanotubes 10 for providing attractions therein between which enable the carbon nanotubes to stand vertically on the metal pad 32 forming a bundle-like bump. The present invention novel method can be carried out at or near room temperature in a solution without the need for high temperature chemical vapor deposition technique used in the conventional method for growing carbon nanotubes. Any possible damage to the semiconductor devices formed on the wafer due to high temperature can thus be avoided.

Figure 3A:
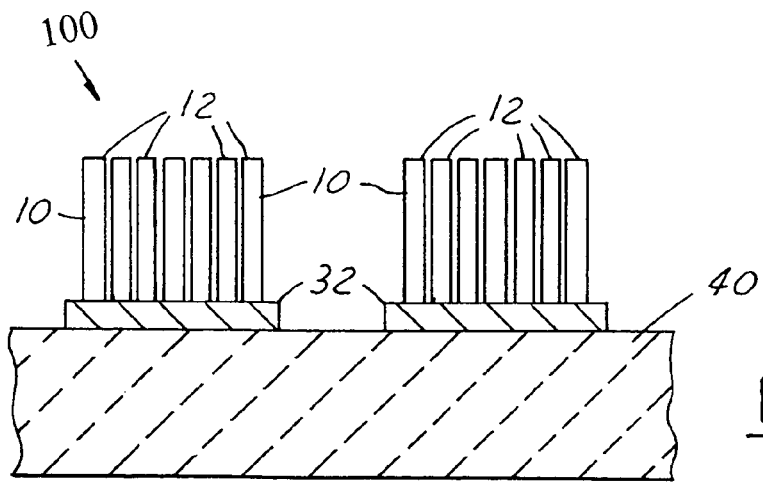
FIGS. 3A–3D are enlarged, cross-sectional views illustrating the present invention process for forming the self-assembled nanometer conductive bumps on a substrate.
Figure 3B:
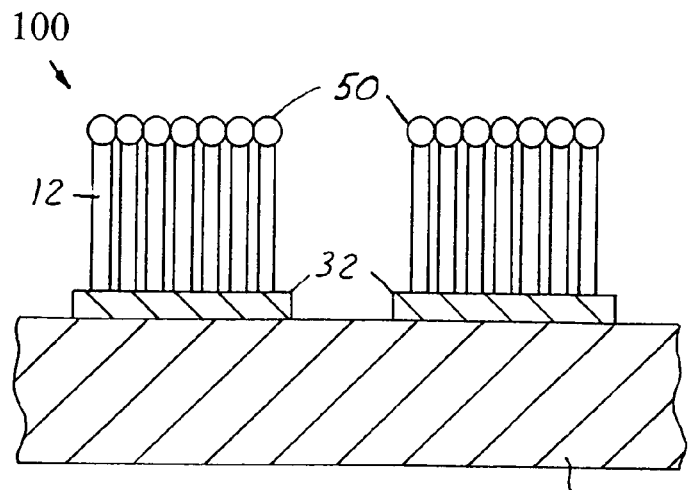

When further improvement in the bond strength formed between the carbon nanotubes and the metal pad is necessary, a layer of solder material may be used to connect between the carbon nanotubes 10 and the substrate. For instance, as shown in FIG. 3A, on top of a removable template 40, is first formed by carbon nanotubes 10 a bundle-like bump. The structure 100, as shown in FIG. 3A, is then further processed by adding nanometer-scaled gold spheres 50 to the top ends 12 of the carbon nanotubes 10. Due to a strong bonding force formed between the sulfur atoms and the ends 12, 14 of the carbon nanotubes 10, the sulfur atoms form a strong bond with the nanometer-scaled gold spheres 50 such that the nanometer scaled gold spheres 50 are strongly adhered to the ends 12 of the carbon nanotubes 10. When the density of the carbon nanotubes 10 is sufficiently high and the dimension of the nanometer-scaled gold sphere 50 is small enough, the single layer of nanometer-scaled gold sphere 50 forms a wetting layer for the soldering process to further assist the bonding of the carbon nanotubes 10 to the substrate 60.

Figure 3C:
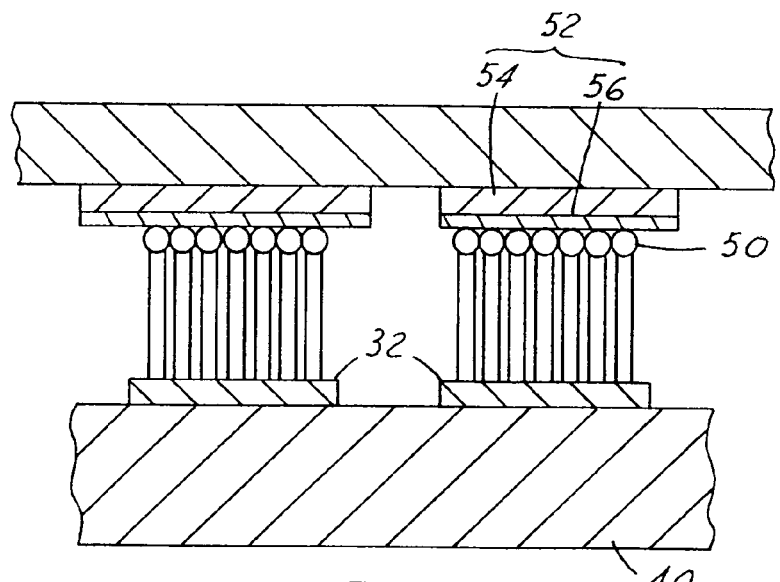
Figure 3D:
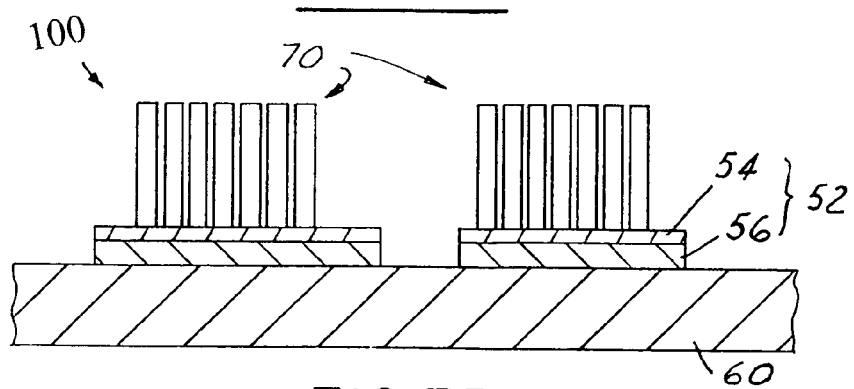

In the next step of the process, as shown in FIG. 3C, metal pad 52 (or solder pad) is formed by a dual-layer structure of a gold layer 54 and a tin layer 56. The gold layer may have a thickness of about 1500 Å, while the tin layer may have a thickness of about 1000 Å. The carbon nanotubes 10 normally has a thickness between about 1 $\mu$m and about 2 $\mu$m. The template 40 used may have a thickness between about 50 microns and about 100 microns. The nanometer-scaled gold spheres 50 may have a diameter between about 2 nm and about 5 nm. The gold spheres can be advantageously attached to the ends of the carbon nanotubes 10 by a dipping method.

The metal pad 52 may be heated during a bonding process to about 300° C. to facilitate the bonding between the nanometer-scaled gold spheres 50 and the tin layer 56. After the formation of the gold-tin alloy, the carbon nanotubes 10 are strongly bonded to the substrate 60, as shown in FIG. 3C.

The eutectic melting point for gold-tin alloy is about 280° C. A gold-tin alloy can thus be readily formed when the bonding temperature used is about 300° C.

In the final step of the process, the present invention is completed by removing the template layer 40, by a process such as a wet etch process to form the final structure 100 with self-assembled carbon nanotube bumps 70.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A self-assembly method for fabricating nanometer conductive bumps comprising the steps of:
   providing a multiplicity of carbon nanotubes, each of said multiplicity of carbon nanotubes having two free ends;
   attaching to said two free ends of said multiplicity of carbon nanotubes a plurality of functional groups;
   providing a template having at least one metal pad on a surface;
   attaching said multiplicity of carbon nanotubes to said at least one metal pad by an attraction force existed between said plurality of functional groups on said free end of said carbon nanotubes and said metal pad;
   attaching a multiplicity of nanometer metal balls to the other free end of said multiplicity of carbon nanotubes forming a nanometer metal layer;
   providing a substrate having at least a bond pad on a surface;
   attaching said nanometer metal layer on said multiplicity of carbon nanotubes to said bond pad on the substrate; and
   removing said template.

2. A self-assembly method for fabricating nanometer conductive bumps according to claim 1 further comprising the step of providing said functional groups from a group consisting of thiol groups, amide groups, imine groups and isocyanide groups.

3. A self-assembly method for fabricating nanometer conductive bumps according to claim 1 further comprising the step of fabricating said nanometer metal layer from a metal selected from the group consisting of gold, silver, copper, platinum and palladium.

4. A self-assembly method for fabricating nanometer conductive bumps according to claim 1 further comprising the step of removing said template by a wet etch method.

5. A self-assembly method for fabricating nanometer conductive bumps according to claim 1 further comprising the step of forming said nanometer metal layer with a metal that provides wetting characteristics during said attachment process between the nanometer metal layer and the bond pad on the substrate.

6. A self-assembly method for fabricating nanometer conductive bumps according to claim 1 further comprising the step of attaching said nanometer metal layer to said bond pad on the substrate by a solder layer.

* * * * *